(12) United States Patent
Zhou et al.

(10) Patent No.: US 12,495,620 B2
(45) Date of Patent: Dec. 9, 2025

(54) COATING APPARATUS, METHOD AND SYSTEM, SOLAR CELL, MODULE, AND POWER GENERATION SYSTEM

(71) Applicant: SUZHOU MAIZHENG TECHONOLOGY CO. LTD, Jiangsu (CN)

(72) Inventors: Jian Zhou, Suzhou (CN); Xinmin Cao, Suzhou (CN); Chen Chen, Suzhou (CN); Dengzhi Wang, Suzhou (CN); Chao Wang, Suzhou (CN)

(73) Assignee: SUZHOU MAIZHENG TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/016,443

(22) Filed: Jan. 10, 2025

(65) Prior Publication Data

US 2025/0151416 A1    May 8, 2025

Related U.S. Application Data

(62) Division of application No. 18/017,558, filed as application No. PCT/CN2021/086384 on Apr. 12, 2021, now Pat. No. 12,230,728.

(30) Foreign Application Priority Data

Aug. 3, 2020   (CN) .......................... 202010764966.8

(51) Int. Cl.
*H10F 10/166* (2025.01)
*C23C 16/24* (2006.01)
(Continued)

(52) U.S. Cl.
CPC ........... *H10F 10/166* (2025.01); *C23C 16/24* (2013.01); *C23C 16/54* (2013.01); *H10F 71/121* (2025.01)

(58) Field of Classification Search
CPC ...... H10F 10/165; H10F 10/166; H10F 71/00; H10F 71/10; H10F 71/107; H10F 71/121; C23C 16/24; C23C 16/54
See application file for complete search history.

(56) References Cited

U.S. PATENT DOCUMENTS

| 4,808,554 A | 2/1989 | Yamazaki |
| 2009/0208668 A1 | 8/2009 | Choi et al. |

(Continued)

FOREIGN PATENT DOCUMENTS

| CN | 101471228 A | 7/2009 |
| CN | 102104088 A | 6/2011 |

(Continued)

OTHER PUBLICATIONS

Machine translation of CN-102104088-A, Liu, Wan-xue. (Year: 2011).*

(Continued)

*Primary Examiner* — Mayla Gonzalez Ramos
(74) *Attorney, Agent, or Firm* — GREENBLUM & BERNSTEIN, P.L.C.

(57) ABSTRACT

Provided are a heterojunction solar cell film deposition apparatus, method and system, a solar cell, a module, and a power generation system. The heterojunction solar cell film deposition apparatus is configured for amorphous silicon-based film deposition, and comprises a loading chamber, a preheating chamber, intrinsic process chambers, doping process chambers and an unloading chamber that are linearly arranged in sequence, the chambers being isolated from each other by means of an isolating valve. At least two intrinsic process chambers are provided and are configured for deposition by means of an intrinsic layer silicon film process; and at least one doping process chamber is provided and is configured for deposition by means of an N-type silicon film or P-type silicon film process. The preheating chamber (Continued)

comprises a heating preheating chamber and a preheating buffer chamber that is configured for adjusting the gas and pressure atmosphere.

10 Claims, 4 Drawing Sheets

(51) Int. Cl.
*C23C 16/54* (2006.01)
*H10F 71/00* (2025.01)

(56) References Cited

U.S. PATENT DOCUMENTS

| | | |
|---|---|---|
| 2010/0151680 A1 | 6/2010 | Wang et al. |
| 2011/0006040 A1 | 1/2011 | Savas et al. |
| 2012/0045864 A1 | 2/2012 | Wada |
| 2021/0335585 A1 | 10/2021 | Cord et al. |

FOREIGN PATENT DOCUMENTS

| | | | |
|---|---|---|---|
| CN | 202626293 U | 12/2012 | |
| CN | 102859678 A | 1/2013 | |
| CN | 103094403 A | 5/2013 | |
| CN | 105154852 A | 12/2015 | |
| CN | 110512183 A | 11/2019 | |
| CN | 110527988 A | 12/2019 | |
| CN | 110656323 A | 1/2020 | |
| CN | 111739971 A | 10/2020 | |
| CN | 213447300 A | 6/2021 | |
| DE | 102018004086 A1 | 11/2019 | |
| JP | 2013-118351 A | 6/2013 | |
| JP | 2019-165260 A | 9/2019 | |
| WO | 2009/029902 A1 | 3/2009 | |
| WO | 2019/219292 A2 | 11/2019 | |

OTHER PUBLICATIONS

International Search Report issued in corresponding Patent Application No. PCT/CN2021/086384 dated Jul. 16, 2021, along with English translation.
Written Opinion of the International Search Report issued in corresponding Patent Application No. PCT/CN2021/086384 dated Jul. 16, 2021, along with English translation.
Office Action issued in corresponding Chinese Patent Application No. 202010764966.8 dated Oct. 13, 2020.
Office Action issued in corresponding Chinese Patent Application No. 202010764966.8 dated Nov. 4, 2020.
Office Action issued in corresponding Chinese Patent Application No. 202010764966.8 dated Nov. 17, 2020.
Office Action issued in corresponding Indian Patent Application No. 202337005072 dated Feb. 2, 2024.
European Search Report issued in corresponding European Patent Application No. 21854146.4 dated Aug. 13, 2024.
Written Opinion issued in corresponding Korean Patent Application No. 10-2023-7003618 dated Aug. 27, 2024.

\* cited by examiner

COATING APPARATUS, METHOD AND SYSTEM, SOLAR CELL, MODULE, AND POWER GENERATION SYSTEM

CROSS-REFERENCE TO RELATED APPLICATIONS

This application is a divisional application of U.S. patent application with Ser. No. 18/017,558, filed on Apr. 12, 2021, which is a national stage of PCT Patent Application No. PCT/CN2021/086384 filed on Apr. 12, 2021, which itself claims priority to Chinese patent application No. 202010764966.8 filed on Aug. 3, 2020. The contents of the above identified applications are hereby incorporated herein in their entireties by reference.

TECHNICAL FIELD

The present disclosure relates to solar cell processing, in particular to a heterojunction solar cell film deposition apparatus, method and system, solar cell, module, and power generation system.

BACKGROUND

Silicon heterojunction solar cell is a solar cell technology that deposits amorphous silicon-based films on the surface of crystalline silicon to form a heterojunction. Compared with traditional crystalline silicon cells and silicon film cells, it has the advantages of simple process, high power generation and low power cost, and have become a hot spot in the photovoltaic industry.

Amorphous silicon-based films of intrinsic layer i/doped layer n or intrinsic layer i/doped layer p are deposited on the upper and lower surfaces of crystalline silicon by PECVD technology in silicon heterojunction solar cell which are characterized by thin and multi-layered films. Generally, one type of amorphous silicon film requires 2 to 10 different reaction gases and process conditions to complete the deposition, which is achieved through process recipe control to achieve the best silicon surface passivation and heterojunction doping effect.

The existing mass-produced PECVD film deposition apparatus usually adopts in-line chamber arrangement, and the deposition process of amorphous silicon film layer is realized by setting a single or multiple closed chambers. For example, the patent with Publication No. CN110835726A provides a method of processing the intrinsic layer and the doped layer in separate chambers, and the vacuum pump and the vacuum lock in each chamber are used to control the processing environment of each chamber.

In the current solar cell processing technology, the photoelectric conversion efficiency is generally about 22.8%, even if the efficiency is increased by 0.1%, a large cost is required. In the commercialization of mass production, how to improve the processing efficiency is more important. However, in the research on the deposition of intrinsic amorphous silicon-based film passivation layer by PECVD, the influence of process parameters such as gas source type, flow rate of various gases, deposition power density, deposition time, deposition pressure and so on is mostly studied, while the research on processing efficiency is less. One of the reasons is that the processing efficiency is absolutely affected by the deposition rate, and the deposition efficiency is affected by most of the above process parameters, which are coupled together, and it is difficult to distinguish which influence is caused by the deposition rate alone.

Based on the above reasons, how to reduce the deposition time of heterojunction solar cells on the basis of the existing technology through further exploration and research is of great significance to the commercial mass production of the solar cell.

SUMMARY

1. The Technical Problem to be Solved by the Present Disclosure

The purpose of the present disclosure is to overcome the disadvantage of low overall processing efficiency of solar cell wafers in the prior art, and provide a heterojunction solar cell film deposition apparatus, which can improve the processing efficiency by optimizing the chamber setting.

Further, the present disclosure also provides a film deposition method for a heterojunction solar cell, which is based on a film deposition processing equipment, and can process a plurality of solar cells at the same time, thereby improving the overall processing efficiency.

Further, the present disclosure also provides a heterojunction solar cell film deposition system, which uses two sets of equipment to form a complete production line, and can efficiently complete the deposition processing of two surfaces of solar cell wafers.

Further, the present disclosure also provides a heterojunction solar cell. The solar cell processed by the new film deposition method has better performance and longer service life, especially applied to solar module and power generation systems.

2. Technical Solution

To achieve the above objectives, the technical solution provided by the present disclosure is:

A heterojunction solar cell film deposition apparatus configured to deposit an amorphous silicon-based film of a heterojunction solar cell and comprising a process chamber, wherein the process chamber includes: at least two intrinsic process chambers configured to deposit an intrinsic layer silicon film; at least one doping process chamber configured to deposit an N-type silicon film or a P-type silicon film; wherein the chambers are isolated by isolation valves, the chambers of the film deposition apparatus are linearly arranged in an order of a loading chamber, a preheating chamber, the at least two intrinsic process chambers, the at least one doping process chamber, and an unloading chamber, a pressure difference between the process chambers of the same type is less than 20%; wherein the preheating chamber includes: a heating preheating chamber configured to heat a carrier plate loaded with a solar cell wafer to be processed; and a preheating buffer chamber located between the heating preheating chamber and the intrinsic process chamber and configured to adjust gas and pressure atmosphere.

In one of the embodiments, the unloading chamber includes an unloading buffer chamber and a discharging unloading chamber.

In one of the embodiments, in a direction of a processing sequence, a proportion of hydrogen in a latter intrinsic process chamber is higher than or equal to a proportion of hydrogen in a former intrinsic process chamber.

In one of the embodiments, the intrinsic process chamber and the doping process chamber are provided with a capacitance-coupling flat plate structure configured to form the film by chemical vapor deposition.

In one of the embodiments, a flat plate capacitance distance between the capacitance-coupling flat plate in the process chamber and the carrier plate loaded with the solar cell wafer to be processed is 5 mm to 60 mm.

In one of the embodiments, wherein the flat plate capacitance distances between the at least two the process chambers are different.

In one of the embodiments, one or more process chambers are provided with an independent heating module therein configured to adjust a working temperature of the chambers to be within 100° C. to 400° C.

In one of the embodiments, the temperatures in at least two process chambers are different.

In one of the embodiments, the film deposition apparatus is provided with the carrier plate configured to load the solar cell wafer to be processed, the carrier plate is transferred by a roller mechanism, a transmission speed of a roller is 100 mm/s to 800 mm/s.

In one of the embodiments, the transmission speed of the roller is 200 mm/s to 700 mm/s.

In one of the embodiments, the transmission speed of the roller is 300 mm/s to 600 mm/s.

In one of the embodiments, an upper surface of the carrier plate is coated with an insulating coating.

In one of the embodiments, a lower surface of the carrier plate is coated with a conductive coating.

In one of the embodiments, the carrier plate is a composite structure comprising a base plate and a support unit, the base plate is provided with a plurality of placing portions arranged in an array, and the support unit is provided in each placing portion. In an embodiment, the carrier plate is a C/C (carbon-carbon) graphite composite structure, which includes the base plate made of C/C composite material and the support unit made of graphite material.

In one of the embodiments, the preheating chamber heat the carrier plate and the loaded solar cell wafer on the carrier plate by a non-contact heating method.

In one of the embodiments, the non-contact heating method is a heating method using an infrared lamp tube or a heating wire, the infrared lamp tube or the heating wire is located at a bottom of the preheating chamber and heats the carrier plate from a lower side; or the non-contact heating method includes a heating method using an infrared lamp tube and a heating wire, the infrared lamp tube is located in the preheating chamber and is located on a lower side of the carrier plate, and the heating wire is located in the preheating chamber and is located on an upper side of the carrier plate.

In one of the embodiments, the intrinsic process chamber and the doping process chamber are connected to corresponding vacuum pumps configured to evacuate the chambers, and an angle valve and/or a butterfly valve are provided to control the pressure of the chambers.

In one of the embodiments, the chambers of the same type share one vacuum pump, and a pipeline of the vacuum pump is provided with the angle valve and/or the butterfly valve, and a plug-in valve.

In one of the embodiments, two to six intrinsic process chambers are provided, and one to four doping process chamber is provided.

In one of the embodiments, the heterojunction solar cell film deposition apparatus includes the loading chamber, the preheating chamber, two intrinsic process chambers, one doping process chamber, and the unloading chamber that are linearly arranged in sequence from front to back.

In one of the embodiments, the heterojunction solar cell film deposition apparatus includes the loading chamber, the preheating chamber, three intrinsic process chambers, one doping process chamber, and the unloading chamber that are linearly arranged in sequence from front to back; or the heterojunction solar cell film deposition apparatus includes the loading chamber, the preheating chamber, three intrinsic process chambers, two doping process chambers, and the unloading chamber that are linearly arranged in sequence from front to back; or the heterojunction solar cell film deposition apparatus includes the loading chamber, the preheating chamber, four intrinsic process chambers, two doping process chambers, and the unloading chamber that are linearly arranged in sequence from front to back.

In one of the embodiments, the heterojunction solar cell film deposition apparatus includes the loading chamber, the heating preheating chamber, the preheating buffer chamber, three intrinsic process chambers, two doping process chambers, and the unloading chamber that are linearly arranged in sequence from front to back; or the heterojunction solar cell film deposition apparatus includes the loading chamber, the heating preheating chamber, the preheating buffer chamber, four intrinsic process chambers, two doping process chambers, the unloading buffer chamber, and the unloading chamber that are linearly arranged in sequence from front to back; or the heterojunction solar cell film deposition apparatus includes the loading chamber, the heating preheating chamber, the preheating buffer chamber, five intrinsic process chambers, three doping process chambers, the unloading buffer chamber, and the discharging unloading chamber that are linearly arranged in sequence from front to back.

In one of the embodiments, an isolation chamber is provided between the intrinsic process chamber and the doping process chamber, and the chambers are isolated by isolation valves.

In one of the embodiments, the heterojunction solar cell film deposition apparatus includes the loading chamber, the preheating chamber, three intrinsic process chambers, the isolation chamber, the doping process chamber, and the unloading chamber that are linearly arranged in sequence from front to back; or the heterojunction solar cell film deposition apparatus includes the loading chamber, the preheating chamber, three intrinsic process chambers, the isolation chamber, two doping process chambers, and the unloading chamber that are linearly arranged in sequence from front to back; or the heterojunction solar cell film deposition apparatus includes the loading chamber, the preheating chamber, four intrinsic process chambers, the isolation chamber, two doping process chambers, and the unloading chamber that are linearly arranged in sequence from front to back.

In one of the embodiments, the heterojunction solar cell film deposition apparatus includes the loading chamber, comprising the loading chamber, the heating preheating chamber, the preheating buffer chamber, three intrinsic process chambers, the isolation chamber, and two doping processes chambers and the unloading chamber that are linearly arranged in sequence from front to back; or the heterojunction solar cell film deposition apparatus includes the loading chamber, the heating preheating chamber, the preheating buffer chamber, four intrinsic process chambers, the isolation chamber, two doping process chambers, an unloading buffer chamber, and a discharging unloading chamber that are linearly arranged in sequence from front to back; or the heterojunction solar cell film deposition apparatus includes the loading chamber, the heating preheating chamber, the preheating buffer chamber, five intrinsic process chambers, the isolation chamber, three doping process chambers, an unloading buffer chamber, and a discharging unloading chamber that are linearly arranged in sequence from front to back; or the heterojunction solar cell film deposition apparatus includes the loading chamber, the heating preheating chamber, the preheating buffer chamber, six intrinsic process chambers, the isolation chamber, four doping process chambers, an unloading buffer chamber, and a discharging unloading chamber that are linearly arranged in sequence from front to back.

In one of the embodiments, the heterojunction solar cell film deposition apparatus further includes a return mechanism, wherein the return mechanism sends the carrier plate back to a feeding station using a roller or a belt structure.

A method for producing a heterojunction solar cell using the above-mentioned cell film deposition apparatus, includes: after feeding in the loading chamber, the carrier plate is heated through the heating preheating chamber, then the gas and pressure atmosphere are adjusted in the preheating buffer chamber, then the carrier plate is transported to the intrinsic process chamber, and the film deposition processing of the intrinsic layer silicon film is completed in steps in at least two intrinsic process chambers, and then the carrier plate is transported to the doping process chamber, and the deposition of N-type silicon film or P-type silicon film is completed through at least one doping process chamber, when the doping process chamber is working, the intrinsic process chamber is in a waiting state or is in a deposition state on the heterojunction solar cell wafer on another carrier plate.

In one of the embodiments, the carrier plate is transferred synchronously though a roller mechanism, when the carrier plate is transferred between adjacent process chambers, the isolation valve between the chambers is opened, and process gas is constantly introduced into the chambers.

In one of the embodiments, the method includes: S1, the carrier plate is transported in the loading chamber; S2, the carrier plate is preheated by non-contact heating in the heating preheating chamber to reach a temperature required by the process, then go to the preheating buffer chamber to adjust the gas and pressure atmosphere in the chamber so that the carrier plate directly enters the intrinsic process chamber; S3, film deposition processing is performed in the first intrinsic process chamber, a film deposition is performed on the capacitance-coupling flat plate structure based on chemical vapor deposition method in the process chamber, and after the processing is completed, the carrier plate enters next intrinsic process chamber to continue film deposition processing; S4, the processing of the intrinsic layer silicon film is completed in the intrinsic process chamber, and then the carrier plate enters the doping process chamber to perform the film deposition process of the N-type silicon film or the P-type silicon film; S5, after step S4 is completed, the carrier plate is unloaded through the unloading chamber; and S6, the rollers of the return mechanism return the carrier plate to the loading chamber, and the carrier plate is kept warm during the process.

A heterojunction solar cell film deposition system includes at least two groups of the above-mentioned heterojunction solar cell film deposition apparatus, wherein one of the heterojunction solar cell film deposition apparatus is configured to deposit the intrinsic layer silicon film and N-type silicon film on one side of the solar cell wafer, another one of the heterojunction solar cell film deposition apparatus is configured to deposit the intrinsic layer silicon film and P-type silicon film on the other side of the solar cell wafer.

A heterojunction solar cell is provided, wherein the above-mentioned heterojunction solar cell film deposition apparatus is configured to perform silicon film process.

A heterojunction solar module of the present disclosure includes a plurality of heterojunction solar cells connected in series, the cell is a heterojunction solar cell processed by the above-mentioned heterojunction solar cell film deposition apparatus or method.

A photovoltaic power generation system includes the above-mentioned heterojunction solar module, which is used for solar power generation.

3. Beneficial Effect

Compared with the prior art, the technical solution provided by the present disclosure has the following beneficial effects:

(1) The present disclosure expands the intrinsic process chamber. In the traditional technology, the film processing in a single closed chamber is decomposed into multiple continuous intrinsic process chambers for processing and deposition, which can reduce the processing waiting time of solar cell wafers. The same equipment can process multiple solar cell wafers at the same time, thus improving the processing efficiency.

(2) The present disclosure adopts the scheme of multiple intrinsic process chambers and multiple doping process chambers, which is not only more conducive to the processing control of the film layers in different thickness regions, but also can be balanced in time and create a foundation for the synchronous transmission of each carrier plate. In addition, in order to ensure the processing quality, gas delivery is maintained during the movement of the carrier plate, and the gas ratio and pressure are controlled to a certain extent, so as to prevent the chamber from being polluted and ensure the effective operation of the corresponding processing process.

(3) The present disclosure is based on the idea of using multiple chambers for processing the same film layer, reducing the residence time in each chamber, and reducing the retention time in the accessory chamber for non-deposition processing, so as to improve the processing efficiency. It is also possible to provide an isolation chamber between the intrinsic process chamber and the doping process chamber to avoid the mixing of gases between two different types of chambers, and can reduce the vacuum pumping time in the processing process and ensure the effective operation of the corresponding processing process. On this basis, the processing system can complete the processing of the front and back sides of the solar cell wafer on a carrier plate, which has great practical value.

Figure 1:
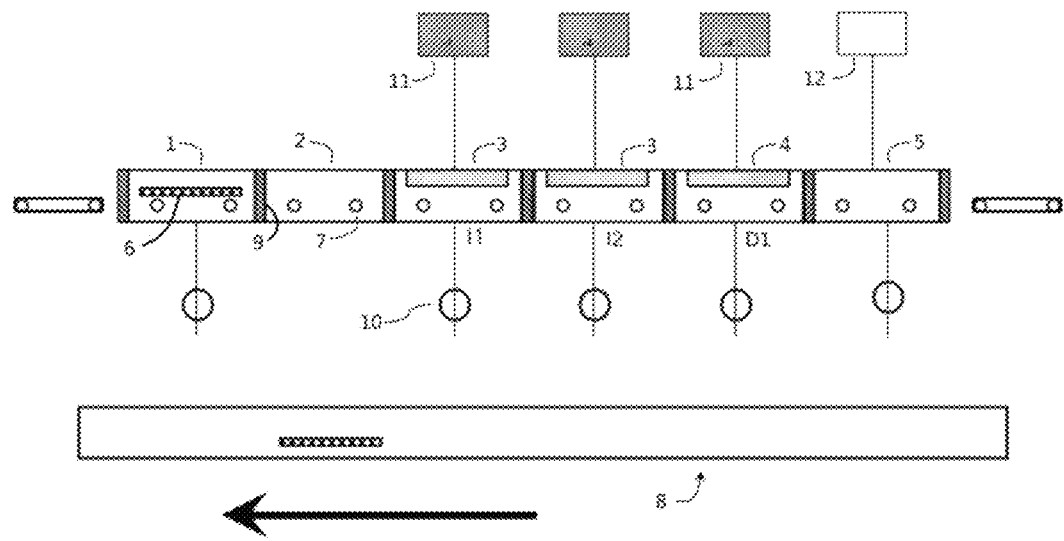
FIG. 1 is a schematic diagram of a film deposition apparatus with two intrinsic process chambers.

Description of elements in the drawings:
1: loading chamber;
2: preheating chamber;
3: intrinsic process chamber;
4: doping process chamber;
5: unloading chamber;
6: carrier plate;
7: roller mechanism;
8: return mechanism;
9: isolation valve;
10: vacuum pump;
11: plasma power supply and process gas;
12: process gas;
13: isolation chamber.

DETAILED DESCRIPTION OF THE EMBODIMENTS

The present disclosure will now be described in detail with reference to the accompanying drawings and embodiments in order to further understand the present disclosure.

The structures, proportions, sizes, etc. shown in the drawings are only used to cooperate with the contents disclosed in the specification for the understanding and reading of those who are familiar with the technology, and are not used to limit the conditions for the implementation of the present disclosure, so they have no technical significance. Any modification of the structure, change of the scale relationship or adjustment of the size, without affecting the efficacy and the purpose of the present disclosure, should still fall within the scope of the technical content disclosed in the present disclosure. Meanwhile, the terms such as "up", "down", "left", "right" and "middle", etc. quoted in the specification are only for the sake of clarity of description, and are not used to limit the scope of implementation. The change or adjustment of the relative relationship should also be regarded as the scope of implementation of the present disclosure without substantial change in technical content.

First Embodiment

A heterojunction solar cell film deposition apparatus according to the embodiment is configured to deposit an amorphous silicon-based film of a heterojunction solar cell wafer, which may include a loading chamber 1, a preheating chamber 2, a process chamber, an unloading chamber 5 and other basic chamber structures required for processing that are arranged linearly.

The loading chamber 1 is configured to feed and as an entry of a carrier plate.

The preheating chamber 2 is used for preheating the carrier plate. The carrier plate can be preheated by a non-contact heating method to reach a temperature required by the process.

The process chamber is used for deposition processing. According to the process requirements, a corresponding gas is introduced, a vacuum pump 10 is used to form a vacuum environment or maintain an air pressure, a plasma power supply and the process gas 11 are used to form a processing environment, and an intrinsic layer silicon film and an N or P type silicon film are deposited in the process chamber.

The unloading chamber 5 is configured to cool the carrier plate 6 and unload the solar cell wafer on the carrier plate. The chamber may be connected to the vacuum pump 10 and the process gas 12 for adjusting the environment in the chamber.

During processing, the carrier plate 6 is configured to load the solar cell wafer to be processed. The chambers are arranged linearly. A roller mechanism 7 is provided in cooperation with the chambers so that the carrier plate can pass through each of the chambers. The structure of part of the apparatus can be referred to patents, such as CN110835739A, CN110835736A, and CN110527988A.

One side of the solar cell wafer is successively coated with an intrinsic silicon film and an N-type silicon film, and the other side of the solar cell wafer is successively coated with an intrinsic silicon film and a P-type silicon film. The processing of the solar cell in the embodiment only refers to the processing of one side thereof.

Referring to FIG. 1, the improvement of the embodiment is that the process chamber includes an intrinsic process chamber 3 and a doping process chamber 4. At least two intrinsic process chambers are provided for the deposition of an intrinsic layer silicon film process. The doping process chamber is used for the deposition of N-type silicon film or P-type silicon film. The intrinsic process chamber and the doping process chamber are isolated from each other by an isolation valve 9.

In an embodiment, two intrinsic process chambers and one doping process chamber are provided. The doping process chamber is used for deposition processing of N-type silicon film or P-type silicon film, which can be performed according to process requirements. As for the specific method of deposition, a plasma chemical vapor deposition or a hot wire chemical vapor deposition can be used.

In the embodiment, the intrinsic process chamber is further divided into chambers, so that a deposition work of one intrinsic process chamber in the prior art is decomposed into multiple intrinsic process chambers, and the same processing process is decomposed by time. In the process of film deposition, this process is equivalent to adding process procedures and processing equipment, which appears to be at a disadvantage in the progress of commercial mass production of amorphous silicon solar cells. However, based on the processing equipment, when the solar cell wafer on one carrier plate is processed with N-type silicon film or P-type silicon film in the doping process chamber, the intrinsic process chamber can process the solar cell wafer on the other carrier plate at the same time. Alternatively, two carrier plates are simultaneously deposited in two intrinsic process chambers within a certain period of time.

As for a conventional processing equipment, whether for processing of intrinsic layer silicon film, or for depositing N-type silicon film or P-type silicon film, it requires to be stacked repeatedly layer by layer to form a layer structure. Therefore, only after the processing of one side of the solar cell wafer on one carrier plate is completed, the processing of the solar cell wafer on the next carrier plate can be performed, resulting in a long waiting time. In the embodiment, the solar cell wafers on two carrier plates can be processed at the same time, thereby reducing the waiting time and improving the processing efficiency.

Second Embodiment

This embodiment further defines the solution in the first embodiment. The intrinsic process chamber and the doping process chamber are provided with a capacitance-coupling flat plate structure for forming a film by chemical vapor deposition. In this solution, the plasma chemical vapor deposition is preferably used to form the film. In the structure, the capacitance-coupling flat plate structure is connected to RF (radio frequency) or VHF RF (very high frequency radio frequency) power supply, and the frequency of the RF power supply is 10 MHz to 100 MHz.

When the intrinsic layer silicon film is coated, the frequency of the RF power supply between different intrinsic process chambers can be set as required.

The thickness and defect density of the intrinsic layer silicon film have a significant impact on a conversion efficiency of a solar cell. By decomposing the intrinsic layer silicon film processing process, it is easier to control process parameters for the film processing in different thickness ranges, so as to improve the overall intrinsic layer silicon film deposition quality and improve the product performance.

In another embodiment, a flat plate capacitance distance between the capacitance-coupling flat plate in the process chamber and the carrier plate loaded with the solar cell wafer to be processed is 5 mm to 60 mm, such as, 10 mm, 25 mm, 35 mm, 48 mm, etc. The flat plate capacitance distances between different chambers can be the same or different, which is set according to the actual process conditions. Preferably, the capacitance distances between the capacitance-coupling flat plates in at least part of the chambers are different to meet the process requirements for deposition of different films.

Third Embodiment

In the heterojunction solar cell film deposition apparatus of this embodiment, a roller mechanism is provided at a bottom of each chamber, and the carrier plate is transferred through the roller mechanism.

Referring to FIG. 1, the carrier plate does not move during a static film deposition process. When transmission is required, the carrier plate can move at a speed of 90 mm/s to 800 mm/s. When the carrier plate moves, the carrier plate passes through the loading chamber 1, the preheating chamber 2, the intrinsic process chamber I1, the intrinsic process chamber I2, the doping process chamber D1, and the unloading chamber 5 linearly arranged, and the roller mechanism is used to transport of the carrier plate.

More preferably, the speed of the carrier plate can be controlled at 200 mm/s to 700 mm/s, and preferably, the speed of the roller is 300 mm/s to 600 mm/s, such as, 320 mm/s.

If the speed is too high, the carrier plate is easy to vibrate, and the mutual friction between the silicon wafer and the carrier plate will also cause the silicon wafer to wear. If the speed is too small, the efficiency cannot be effectively improved. Therefore, the speed range of 300 mm/s to 600 mm/s is preferred.

In some embodiments, the film deposition apparatus further includes a return mechanism 8, the return mechanism 8 sends the carrier plate back to a feeding station using a roller or a belt structure, so that the carrier plate can be used for the next cycle.

Further, an upper surface of the carrier plate is coated with an insulating film deposition to avoid affecting the potential uniformity of the surface of the solar cell wafer.

Further, a lower surface of the carrier plate is coated with a conductive film deposition to additionally ground the carrier plate, so that the influence of the charge distributed on the carrier plate on the plating film can be effectively prevented.

Figure 2:
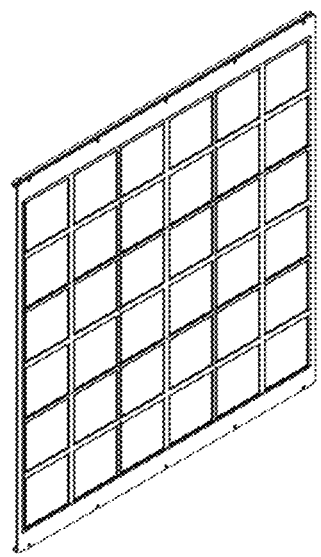
FIG. 2 is a structure view of a carrier plate.

Referring to FIG. 2, the carrier plate is a composite structure, including a base plate and a support unit located on the base plate. In an embodiment, the carrier plate is a C/C (carbon-carbon) graphite composite structure, the base plate is made of C/C composite material, and the support unit is made of graphite material.

The base plate is provided with a plurality of placing portions, preferably the plurality of placing portions are arranged in a rectangular array, and each placing portion is provided with one support unit. In this embodiment, the placing portion may be a groove provided on the base plate, and the groove only penetrates one end surface of the base plate. The placing portion may also be an opening provided on the base plate, and the opening penetrates two opposite end surfaces of the base plate. The support unit is also provided with a silicon wafer placement area for placing the silicon wafer. When the silicon wafer (solar cell wafer to be processed) is coated, the support unit is mounted to the placing portion on the substrate, and the silicon wafer is placed in the silicon wafer placement area on the support unit. This method is the preferred embodiment, and other carrier plate structures can also be used, mainly for placing the product to be processed.

Fourth Embodiment

As another embodiment, this embodiment further defines a preheating mechanism. In this embodiment, the carrier plate is preheated by a non-contact heating method to reach a temperature required by the process. The non-contact heating method includes a heating method using an infrared lamp tube, a heating wire, and other methods similar to an electromagnetic coil heating.

Preferably, in this embodiment, the infrared lamp tube is used for heating, and the infrared lamp tube is located at a bottom of the preheating chamber to preheat the bottom of the carrier plate.

In another embodiment, the heating wire may be provided in the chamber for heating, and the heating wire may be provided above or below the carrier plate.

As another embodiment, in this embodiment, the carrier plate is preheated by non-contact heating to reach the temperature required by the process. The non-contact heating method includes a heating method using an infrared lamp tube and a heating wire, and the two non-contact heating methods are combined. In this embodiment, the infrared lamp tube is arranged in the preheating chamber and located on a lower side of the carrier plate, and the heating wire is arranged in the preheating chamber and located on an upper side of the carrier plate. A heating speed of the infrared lamp tube is fast, and it is easy to cause the temperature of the surface of the carrier plate to be too high. The heating wire heating is relatively uniform, but the efficiency is low. By combining the two methods and limiting the structure, the heating method of this embodiment has better effect and efficiency.

In order to save the preheating time, in another embodiment, a return mechanism 8 may be provided during the return of the carrier plate to preheat or keep the carrier plate warm, so that the preheating time is shorter and the preheating is more uniform during the processing of the next solar cell.

Fifth Embodiment

On the basis of the fourth embodiment, in order to achieve the preheating effect, two preheating chambers can be provided for preheating processing. The same heating method can be used in the two preheating chambers, for example, the infrared lamp tubes are used for heating.

In another method, different heating methods can be used for heating, for example, one uses the infrared lamp tube for heating and the other one uses the heating wire for heating.

Sixth Embodiment

As an embodiment, in this embodiment, an independent heating module is provided in one or more process chambers to adjust a working temperature of the chamber, which is 100° C. to 400° C.

During the deposition process, the heating module can be used to heat the chamber to control the temperature of the two chambers to be different, or control the temperature of all chambers to be different.

The temperature of the chamber is controlled according to specific process conditions. In order to meet different process requirements, the temperatures of different process chambers are mostly different. In an embodiment, the temperature in one of the chambers may be 120° C., and the temperature in the other chamber may be 200° C.

Seventh Embodiment

In combination with the above embodiments, in the heterojunction solar cell film deposition apparatus in this embodiment, process gas will be introduced into the process chamber during processing, and gas delivery will be maintained when the isolation valve between two process chambers of the same type is opened. For the process gas introduced into the intrinsic process chamber, it is defined that the hydrogen proportion in the latter intrinsic process chamber is higher than the hydrogen proportion in the former intrinsic process chamber, or the hydrogen proportion in the latter intrinsic process chamber is equal to the hydrogen proportion in the former intrinsic process chamber. The equality mentioned here means that the two are basically the same, and slight changes are allowed.

Further, the pressure difference between two adjacent intrinsic process chambers is less than 20%. The pressure difference referred hereto refers to the ratio of the pressure difference relative to one of the chambers. The pressure difference can be zero and not more than 20%, so as to stabilize the balance of the overall environment of the two chambers.

In addition, when a plurality of process chambers of the same type are evacuated, a plurality of vacuum pumps can be provided to evacuate respectively. Preferably, referring to FIG. 3, a vacuum pump is used to connect multiple chambers, and a vent valve is provided on a transmission pipeline. The vent valve is an angle valve or a butterfly valve, which is configured to control the pressure in the chamber, or two vent valves are provided at the same time, and the corresponding valve to be operated is selected as required. When the butterfly valve is used, a larger pressure change can be controlled, while the angle valve can adjust the pressure in a small range. In addition, a plug-in valve can be provided on the pipeline to control the on-off of the pipeline.

It should be noted that in the above embodiments, when a single vacuum pump is used to connect the multiple chambers, the multiple chambers should be the same type of chambers, that is, all are intrinsic process chambers or all are doping process chambers.

In this embodiment, the gas ratio and pressure difference between different chambers are utilized to avoid the pollution of the chamber deposition environment, so that a workpiece transfer between adjacent chambers can be realized without the isolating chamber.

In another embodiment, it is also possible not to continue to deliver gas after the isolation valve is opened, and after the transmission is completed, the isolation valve is closed, it takes a certain period of time to evacuate the chamber through the vacuum pump, so as to avoid environmental pollution in the chamber.

Eighth Embodiment

In combination with the above embodiments, as a further improvement of the heterojunction solar cell film deposition apparatus, 2 to 6 intrinsic process chambers and 1 to 4 doping process chambers may be provided.

In cooperation with it, multiple loading chambers and multiple unloading chambers can also be provided.

For the multi-chamber structure, the roller mechanism and the carrier plate can be synchronously transferred, that is, the rollers are driven to rotate synchronously, so that different carrier plates can move synchronously.

The roller mechanism can also be controlled in sections, that is, partial rollers can be used to drive the carrier plate to move independently, and the processing time difference between different chambers can be adjusted.

Ninth Embodiment

Preferably, the heterojunction solar cell film deposition apparatus includes one loading chamber, one preheating chamber, three intrinsic process chambers, one doping process chamber, and one unloading chamber, which are linearly arranged in sequence from front to back.

The three intrinsic process chambers are respectively an intrinsic process chamber I1, an intrinsic process chamber I2, and an intrinsic process chamber I3. The three intrinsic process chambers cooperatively complete the deposition process of the intrinsic layer silicon film.

In the structure of the solar cell film deposition apparatus, the processing time of each intrinsic process chamber is shortened, and the processing time of the doping process chamber may be relatively longer. A time difference can be adjusted by using the segmented control scheme of the roller mechanism.

Tenth Embodiment

As an improvement, 3 to 5 intrinsic process chambers and 2 to 3 doping process chambers may be provided.

Figure 3:
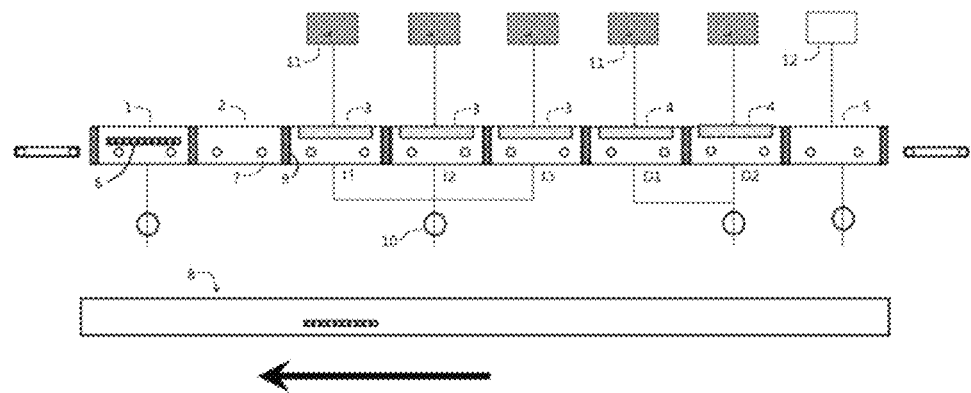
FIG. 3 is a schematic diagram of an embodiment with three intrinsic process chambers and two doping process chambers.

Referring to FIG. 3, in this embodiment, the heterojunction solar cell film deposition apparatus includes one loading chamber, one preheating chamber, three intrinsic process chambers, two doping process chambers, and one unloading chamber, which are linearly arranged in sequence from front to back.

In this embodiment, the doping process chamber is also divided into two chambers, the doping process chamber D1 and the doping process chamber D2, so that the N-type silicon film or the P-type silicon film is cooperatively completed by the two doping process chambers.

Eleventh Embodiment

Figure 4:
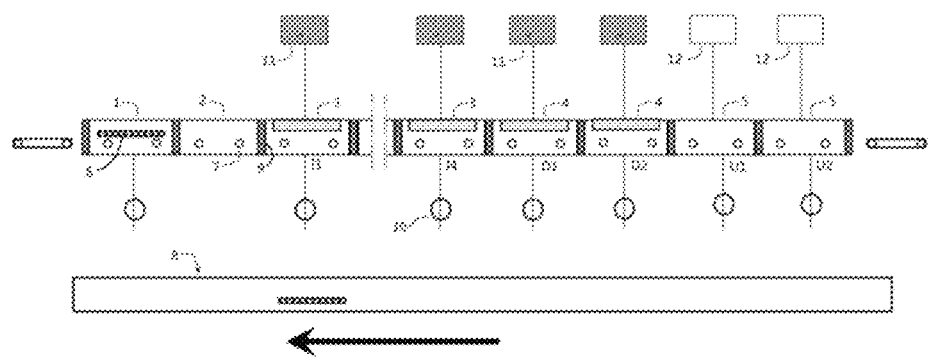
FIG. 4 is a schematic diagram of an embodiment with four intrinsic process chambers and two doping process chambers.

Referring to FIG. 4, in this embodiment, the heterojunction solar cell film deposition apparatus includes one loading chamber, one preheating chamber, four intrinsic process chambers, which are the intrinsic process chamber I1, the intrinsic process chamber I2, the intrinsic process chamber I3, and the intrinsic process chamber I4, two doping process chambers, which are the doping process chamber D1, the doping process chamber D2, two unloading chambers, which are the unloading buffer chamber U1, the discharging unloading chamber U2, which are linearly arranged in sequence from front to back. The four intrinsic process chambers cooperatively complete the deposition process of the intrinsic layer silicon film. The two doping process chambers are continuously delivered with gas when the carrier plate is transferred, and the pressure can be controlled by the butterfly valve.

Figure 5:
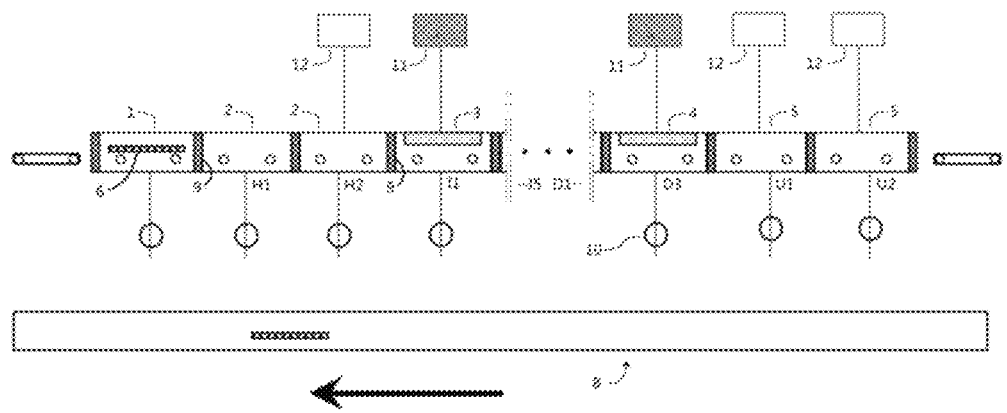
FIG. 5 is a schematic diagram of an embodiment with five intrinsic process chambers and three doping process chambers.

FIG. 5 shows another embodiment, the heterojunction solar cell film deposition apparatus includes one loading chamber, the preheating chambers, which are the heating preheating chamber H1, the preheating buffer chamber H2, five intrinsic process chambers, which are the intrinsic process chamber I1, the intrinsic process chamber I2, the intrinsic process chamber I3, the intrinsic process chamber I4, the intrinsic process chamber I5, three doping process chamber, which are the doping process chamber D1, the doping process chamber D2, the doping process chamber D3, the unloading chambers, which are the unloading buffer chamber U1, the discharging unloading chamber U2, which are linearly arranged in sequence from front to back.

When five intrinsic process chambers are used, the deposition processing time in each intrinsic process chamber is further shortened. In order to balance the processing time, it is better to provide three doping process chambers. After adjustment, a synchronous motion of the roller mechanism can be used to realize the synchronous processing of multiple solar cell wafers, which can greatly shorten the processing time.

In addition, two or three preheating chambers and unloading chambers can also be used, so as to balance the processing time of each chamber as a whole. It should be noted that the loading chamber, the preheating chamber and the unloading chamber are not limited to the functions of loading and unloading and preheating, and corresponding buffer spaces can be provided according to different process requirements. For example, the unloading chamber is divided into two portions, including the unloading buffer chamber and the discharging unloading chamber. The unloading buffer chamber is configured to adjust the temperature and air pressure environment. The discharging unloading chamber is completely in contact with the atmosphere for unloading. The structure can be considered as two unloading chambers, or can be considered as two portions of one unloading chamber, without specific limitation.

Similarly, the loading chamber and the preheating chamber are not limited to a single chamber structure even if there is no limitation in the number in the specification.

In one embodiment, the preheating chamber may include the heating preheating chamber and the preheating buffer chamber, and the film deposition apparatus includes one loading chamber, one heating preheating chamber, two preheating buffer chambers, the intrinsic process chamber I1, the intrinsic process chamber I2, the intrinsic process chamber I3, the intrinsic process chamber I4, the intrinsic process chamber I5, the doping process chamber D1, the doping process chamber D2, the doping process chamber D3, the unloading buffer chamber, the discharging unloading chamber.

When more than three intrinsic process chambers are used, the doping process chamber preferably adopts multiple chamber structures, which can better balance the time. The preheating buffer chamber and the unloading buffer chamber can also be used to shorten the vacuuming time, improve the overall processing efficiency, and achieve better results.

Twelfth Embodiment

In combination with the above embodiments, in this embodiment, an isolation valve is used to isolate the intrinsic process chamber and the doping process chamber, and an isolation chamber I3 is provided between the intrinsic process chamber 3 and the doping process chamber 4.

The film deposition apparatus includes one loading chamber, one preheating chamber, the intrinsic process chamber I1, the intrinsic process chamber I2, the intrinsic process chamber I3, the isolation chamber, the doping process chamber D1, the doping process chamber D2, and one unloading chamber.

On the one hand, the isolation chamber can be used as a gas environment adjustment region between the intrinsic process chamber and the doping process chamber, on the other hand, the isolation chamber can be used as an adjustment region for the deposition time of the intrinsic process chamber and the doping process chamber, so as to avoid the excessive adjustment of the environmental conditions such as pressure and gas in order to adapt to the processing time.

Thirteenth Embodiment

As an extension of the twelfth embodiment, a plurality of intrinsic process chambers may be provided to cooperate with a plurality of doping process chambers. For example, the film deposition apparatus includes one loading chamber, one preheating chamber, the intrinsic process chamber I1, the intrinsic process chamber I2, the intrinsic process chamber I3, the intrinsic process chamber I4, one isolation chamber, the doping process chamber D1, the doping process chamber D2, and one unloading chamber.

Figure 6:
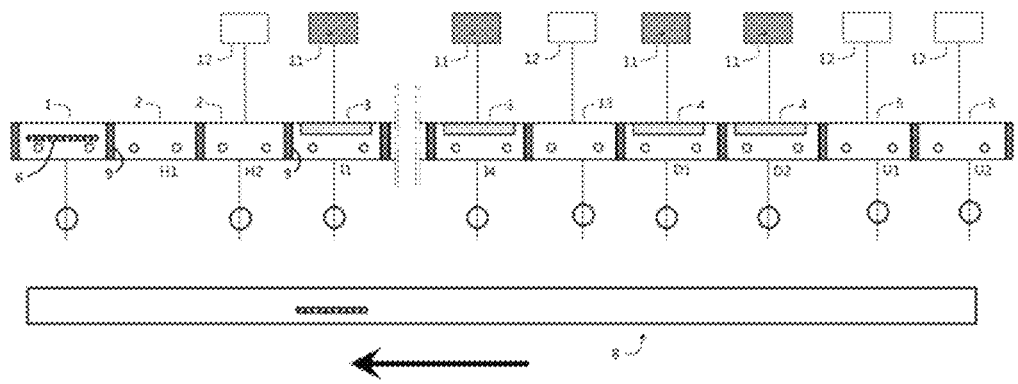
FIG. 6 is a schematic diagram of an embodiment with an isolation chamber.

Referring to FIG. 6, as an extension, the preheating chamber may include the heating preheating chamber and the preheating buffer chamber. The film deposition apparatus includes one loading chamber 1, the heating preheating chamber H1, the preheating buffer chamber H2, the intrinsic process chamber I1, the intrinsic process chamber I2, the intrinsic process chamber I3, the intrinsic process chamber I4, the isolation chamber I3, the doping process chamber D1, the doping process chamber D2, one unloading buffer chamber U1, and one discharging unloading chamber U2.

For another example, the film deposition apparatus includes one loading chamber 1, the heating preheating chamber H1, the preheating buffer chamber H2, the intrinsic process chamber I1, the intrinsic process chamber I2, the intrinsic process chamber I3, the intrinsic process chamber I4, the intrinsic process chamber I5, the isolation chamber, the doping process chamber D1, the doping process chamber D2, the doping process chamber D3, one unloading buffer chamber U1, one discharging unloading chamber U2.

The two portions of the unloading chamber are only for the purpose of unloading, and there is a gradual process of changing the temperature and gas environment before the solar cell wafer is contacted with the atmosphere. In some embodiments, it can also be considered as two unloading chambers.

As an extension, the film deposition apparatus includes one loading chamber, one heating preheating chamber, two preheating buffer chambers, the intrinsic process chamber I1, the intrinsic process chamber I2, the intrinsic process chamber I3, the intrinsic process chamber I4, the intrinsic process chamber I5, the intrinsic process chamber I6, the isolation chamber, the doping process chamber D1, the doping process chamber D2, the doping process chamber D3, the doping process chamber D4, one unloading buffer chamber U1, and one discharging unloading chamber U2.

When five or six intrinsic process chambers are used, the number of doping process chambers is generally three or four, and the isolation chamber is provided between the intrinsic process chamber and the doping process chamber, so that the deposition time can be matched with the intrinsic process chamber. The number of decomposition of the process chambers can be determined according to the number of silicon film.

Fourteenth Embodiment

In combination with the above embodiments, when a doped layer has more film layers, as another embodiment, three intrinsic process chambers are provided in this embodiment, and four doping process chambers are provided.

The film deposition apparatus includes one loading chamber, one preheating chamber, the intrinsic process chamber I1, the intrinsic process chamber I2, the intrinsic process chamber I3, the doping process chamber D1, the doping process chamber D2, the doping process chamber D3, the doping process chamber D4, and one unloading chamber.

Alternatively, the film deposition apparatus includes one loading chamber, one preheating chamber, the intrinsic process chamber I1, the intrinsic process chamber I2, the intrinsic process chamber I3, the isolation chamber, the doping process chamber D1, the doping process chamber D2, the doping process chamber D3, the doping process chamber D4, and one unloading chamber.

Fifteenth Embodiment

For the film deposition apparatus with multiple intrinsic process chambers, this embodiment provides a film deposition method for a heterojunction solar cell. Compared with the conventional process, in this embodiment, the film deposition processing of the intrinsic layer silicon film is completed in steps in at least two intrinsic process chambers, and then the carrier plate is transported to the doping process chamber to complete the film deposition processing of N-type silicon film or P-type silicon film. The intrinsic process chamber and the doping process chamber can simultaneously deposit film on the heterojunction solar cells on different carrier plates.

During processing, each carrier plate on the roller mechanism can be transferred synchronously or controlled independently. When the carrier plate is transferred between adjacent process chambers, the isolation valve between the chambers is opened, and process gas is constantly introduced into the chambers.

The scheme of using multiple intrinsic process chambers and doping process chambers not only facilitates the processing control of film layers in different thickness regions, but also allows for time equalization. In addition, in order to ensure the processing quality, gas delivery is maintained during the movement of the carrier plate, and the gas proportion and pressure are controlled to a certain extent, so as to prevent the chamber from being polluted and ensure the effective operation of the corresponding processing process.

Sixteenth Embodiment

The method for film deposition a heterojunction solar cell in this embodiment includes the following steps:

S1, the carrier plate is transported in the loading chamber. The carrier plate can be placed on the extension of the roller, and then the isolation valve at the entrance of the loading chamber is opened. After transferring to the loading chamber, the isolation valve is closed again, the chamber is evacuated, and the air is discharged to the outside.

S2, the isolation valve is opened, the carrier plate enters the preheating chamber, the isolation valve is closed, and the carrier plate is preheated by non-contact heating to reach the temperature required by the process.

S3, after heating, the isolation valve between the preheating chamber and the intrinsic process chamber I1 is opened, the carrier plate enters the intrinsic process chamber I1, the isolation valve is closed, the process gas is introduced, and the vacuum pump is used to evacuate to keep the pressure in the chamber at the process requirement.

Film deposition processing is performed in the intrinsic process chamber I1. The capacitance-coupling flat plate structure in the process chamber is connected to the RF or VHF RF power supply, and the frequency of the radio frequency power supply is 10 MHz to 80 MHz, after the processing is completed, the carrier plate enters the intrinsic process chamber I2 to continue the deposition process.

S4, the processing of the intrinsic layer silicon film is completed in the intrinsic process chamber, the isolation valve is opened, the carrier plate enters the doping process chamber, and the isolation valve is closed. If the change of the gas environment is small, the doping process chamber is delivered with gas and pumped for a certain period of time. If the gas environment is quite different, the doping process chamber needs to be evacuated, then when the process gas filled into the doping process chamber reaches a certain pressure condition, the film deposition processing of N-type silicon film or P-type silicon film is performed.

S5, after step S4 is completed, the carrier plate is unloaded through the unloading chamber. If the unloading chamber is provided with the buffer chamber, the air pressure and gas environment can be changed first, and then the carrier plate can be removed to unload the solar cell, so as to prevent damage to the product and air pollution. For a separate unloading chamber structure, the vacuum pump and process gas can be used to complete the change of the unloading environment. In an embodiment, vacuum is drawn first, then nitrogen gas is introduced to reach an atmospheric pressure, and then the isolation valve is opened.

S6, after step S5, the roller of the return mechanism returns the carrier plate to the loading chamber. Through the return mechanism, the carrier plate is returned to the feeding station, and can be used for the processing of the next cycle process.

In addition, during the return process, the carrier plate can also be kept warm, so that the carrier plate can be maintained at a certain temperature, which is convenient for rapid preheating in the next cycle.

Seventeenth Embodiment

In this embodiment, four intrinsic process chambers and two doping process chambers are provided, and the processing process is as follows:

S1, the carrier plate is transported in the loading chamber.

S2, the isolation valve is opened, the carrier plate enters the preheating chamber, the isolation valve is closed, and the carrier plate is preheated by non-contact heating to reach the temperature required by the process.

S3, after heating, the isolation valve between the preheating chamber and the intrinsic process chamber I1 is opened, the carrier plate enters the intrinsic process chamber I1, the carrier plate is transferred to the designated position, the isolation valve is closed, and the film deposition process is performed in the intrinsic process chamber I1. After the processing is completed, the gas delivery is kept, the isolation valve is opened, the carrier plate enters the intrinsic process chamber I2, then the isolation valve is closed, and the film deposition process is continued in the intrinsic process chamber I2. The deposition process in the intrinsic process chamber I3 and the intrinsic process chamber I4 is completed according to the above process.

S4, the processing of the intrinsic layer silicon film is completed in the intrinsic process chamber, the isolation valve is opened, the carrier plate enters the doping process chamber D1, the isolation valve is closed, and according to the process environment, determine whether to pump air for delivering gas or vacuumize and then introduce gas to maintain pressure, and then a first film deposition processing of the N-type silicon film or P-type silicon film is performed. Then, the isolation valve between the doping process chamber D1 and the doping process chamber D2 is opened, and the carrier plate enters the doping process chamber D2, and then the isolation valve is closed to complete the film deposition process of N-type silicon film or P-type silicon film.

S5, after step S4 is completed, the carrier plate is unloaded through the unloading chamber.

S6, the return roller of the roller mechanism returns the carrier plate to the loading chamber, and the carrier plate is preheated and kept warm in the process.

It should be noted that, while the film deposition process is performed in the doping process chamber, the multiple intrinsic process chambers may simultaneously process the intrinsic layer silicon film on one or more other solar cell wafers.

Eighteenth Embodiment

Figure 7:
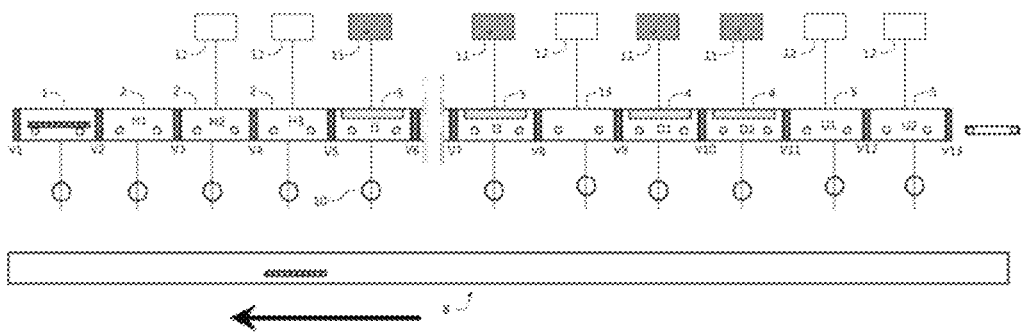
FIG. 7 is a schematic diagram of an embodiment with a buffer chamber and an isolation chamber.

Referring to FIG. 7, the apparatus of this embodiment includes one loading chamber, the heating preheating chamber H1, the preheating buffer chamber H2, the preheating buffer chamber H3, the intrinsic process chamber I1, the intrinsic process chamber I2, the intrinsic process chamber I3, one isolation chamber, the doping process chamber D1, the doping process chamber D2, the unloading buffer chamber U1, and the discharging unloading chamber U2. The specific process is as follows:

Step S1 includes: the carrier plate is transported from the outside through the loading chamber, the isolation valve V1 is opened, the carrier plate is transferred to the loading chamber 1 through the roller, the isolation valve V1 is closed, and the butterfly valve is opened in the loading chamber for vacuuming.

Step S2 includes: the isolation valve V2 is opened, the carrier plate is transferred from the loading chamber 1 to the heating preheating chamber H1 through the roller, the isolation valve V2 is closed, and the upper and lower surfaces of the carrier plate are heated by the heating wire and the infrared lamp tube.

The isolation valve V3 is opened, the carrier plate is transferred from the heating preheating chamber H1 to the preheating buffer chamber H2 through the roller, the isolation valve V3 is closed, and $SiH_4$ is introduced into the preheating buffer chamber H2, and the pressure reaches 0.8 Tor.

A certain amount of $SiH_4$ is introduced into the preheating buffer chamber H3, the pressure is maintained at 0.8 Tor, the isolation valve V4 is opened, the carrier plate is transferred from the preheating buffer chamber H2 to the preheating buffer chamber H3 through the roller, and the isolation valve V4 is closed. The vent valve in the thermal buffer chamber 1 is opened, and the chamber is evacuated to prepare for the next process.

If only the heating preheating chamber H1 and the preheating buffer chamber H2 are provided, as shown in FIG. 6, there is no need to go through the preheating buffer chamber H3, that is, after the isolation valve V4 is opened, the carrier plate directly enters the intrinsic process chamber I1, at this time, the gas and pressure in the preheating buffer chamber H2 and the intrinsic process chamber I1 are the same.

The preheating buffer chamber can be communicated with the heating preheating chamber first, and then the gas and pressure atmosphere can be adjusted, so that the carrier plate can directly enter the intrinsic process chamber, without the need for vacuuming in the intrinsic process chamber to adjust the air pressure and remove other polluting gases.

Step S3 includes: the process gas $SiH_4$ is continuously introduced into the intrinsic process chamber I1, the vent valve controls the pressure in the chamber at 0.8 Tor, the isolation valve V5 is opened, and the carrier plate is transferred from the H3 preheating buffer chamber H3 to the intrinsic process chamber I1 through the rollers, the isolation valve V5 is closed, and a second intrinsic amorphous silicon-based film is deposited on the silicon wafer carried on the carrier plate.

The intrinsic process chamber I2 is continuously fed with process gases $SiH_4$ and H2 in a ratio of 1:1. The vent valve controls the pressure in the chamber at 0.78 Tor, the isolation valve V6 is opened, and the carrier plate is transferred from the intrinsic process chamber I1 to the intrinsic process chamber I2 through the roller, the isolation valve V6 is closed, and a second intrinsic amorphous silicon-based film is deposited on the silicon wafer carried on the carrier plate.

The intrinsic process chamber I3 is continuously fed with process gases $SiH_4$ and H2 in a ratio of 1:5. The vent valve controls the pressure in the chamber at 0.78 Tor, the isolation valve V7 is opened, and the carrier plate is transferred from the intrinsic process chamber I2 to the intrinsic process chamber I3 through the roller, the isolation valve V7 is closed, and a third intrinsic amorphous silicon-based film is deposited on the silicon wafer carried on the carrier plate.

Step S4 includes: a certain amount of H2 is introduced into the isolation chamber I3, the pressure is maintained at 0.78 Tor, the isolation valve V8 is opened, the carrier plate is transferred from the intrinsic process chamber I3 to the isolation chamber I3 through the roller, and the isolation valve V8 is closed.

The doping process chamber D1 is continuously fed with $SiH_4$, $H_2$ and $PH_3$ in a ratio of 1:4:1. The butterfly valve controls the pressure in the chamber at 0.8 Tor, the isolation valve V9 is opened, and the carrier plate is transferred from the isolation chamber I3 to the doping process chamber D1 through the roller, the isolation valve V9 is closed, a first layer of N-type amorphous silicon-based film is deposited on the silicon wafer carried on the carrier plate, and the vent valve in the isolation chamber I3 is opened for vacuuming.

The doping process chamber D2 is continuously fed with $SiH_4$, $H_2$ and $PH_3$ in a ratio of 2:1:3. The vent valve controls the pressure in the chamber at 0.8 Tor, the isolation valve V10 is opened, and the carrier plate is transferred from the doping process chamber D1 to the doping process chamber D2 through the roller, the isolation valve V10 is closed, and a second N-type amorphous silicon-based film is deposited on the silicon wafer carried on the carrier plate.

Step S5 includes: the unloading buffer chamber U1 is fed with a certain amount of $H_2$, the pressure is maintained at 0.8 Tor, the isolation valve V11 is opened, the carrier plate is transferred from the doping process chamber D2 to the unloading buffer chamber U1 through the roller, the isolation valve V11 is closed, the vent valve in the unloading buffer chamber U1 is opened for vacuuming.

The isolation valve V12 is opened, the carrier plate is transferred from the unloading buffer chamber U1 to the discharging unloading chamber U2 through the roller, the isolation valve V12 is closed, the discharging unloading chamber U2 is filled with nitrogen, and the pressure in the chamber reaches one atmosphere.

Step S6 includes: the isolation valve V13 is opened, and the carrier plate is transferred from the discharging unloading chamber U2 to an unloading table in the atmospheric environment through the roller to complete the unloading.

The unloading table sends the carrier plate to the return mechanism, and the silicon wafer is loaded again for the next film deposition cycle.

Nineteenth Embodiment

This embodiment provides a heterojunction solar cell film deposition system, the system includes at least two heterojunction solar cell film deposition apparatuses, one of the apparatuses is configured to deposit the intrinsic layer silicon film and N-type silicon film on one side of the solar cell wafer. Another one of the apparatuses is configured to deposit the intrinsic layer silicon film and P-type silicon film on the other side of the solar cell wafer. The structures of the two groups of apparatus may be the same, except the doping chamber, and any of the above-mentioned film deposition apparatus may be used without specific limitation.

A turning station or other mechanical equipment can be provided between the two groups of apparatus to overturn the solar cell wafer, and the structure has no specific requirements.

Twentieth Embodiment

This embodiment provides a heterojunction solar cell, and a heterojunction solar module is processed by a plurality of the above-mentioned solar cell film deposition apparatus. The solar cell processed by this apparatus not only improve the processing efficiency. Since the deposition work of a single layer is decomposed into multiple chambers, the gas, pressure, temperature and other environmental conditions can be controlled more precisely, and the performance of the solar cell wafer can be improved.

Twenty-First Embodiment

This embodiment provides the heterojunction solar module, which is formed by connecting the above-mentioned solar cells in series. The solar module is mounted on a frame to complete the packaging to form a solar panel, which is used for power generation.

The solar panel is installed in a certain area to form a power generation system. The system is used to generate electricity, which can be used for household power supply or integrated into a power grid to realize an energy conversion of solar energy.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A method for producing a heterojunction solar cell using a film deposition apparatus, wherein the film deposition apparatus comprises a loading chamber, a preheating chamber, an unloading chamber, an isolation chamber, and a process chamber;

the process chamber comprises at least two intrinsic process chambers configured to deposit an intrinsic layer silicon film and at least one doping process chamber configured to deposit an N-type silicon film or a P-type silicon film;

the chambers are isolated by isolation valves, the chambers of the film deposition apparatus are linearly arranged in an order of the loading chamber, the preheating chamber, the at least two intrinsic process chambers, the isolation chamber, the at least one doping process chamber, and the unloading chamber;

a pressure difference between the process chambers of the same type is less than 20%, and the film deposition apparatus is provided with a carrier plate configured to be loaded with a solar cell wafer to be processed;

wherein after the carrier plate loaded with the solar cell wafer is transported to the loading chamber, the carrier plate is heated and the gas and pressure atmosphere are adjusted in the preheating chamber, then the carrier plate is transported to the intrinsic process chambers, and the film deposition processing of the intrinsic layer silicon film is completed in steps in at least two intrinsic process chambers, and then the carrier plate is transported to the isolation chamber and the doping process chamber sequentially, and the deposition of N-type silicon film or P-type silicon film is completed through at least one doping process chamber, wherein when the doping process chamber is working, the intrinsic process chambers are in a waiting state or is in a deposition state on the heterojunction solar cell wafer on another carrier plate.

2. The method for film deposition the heterojunction solar cell according to claim 1, wherein the carrier plate is transferred synchronously though a roller mechanism, and when the carrier plate is transferred between adjacent process chambers, the isolation valve between the chambers is opened, and process gas is constantly introduced into the chambers.

3. The method for film deposition the heterojunction solar cell according to claim 1, comprising:
   S1, the carrier plate is transported in the loading chamber;
   S2, the carrier plate is preheated to reach a temperature required by the process, and the gas and pressure atmosphere is adjusted in the preheating chamber so that the carrier plate directly enters the intrinsic process chambers;
   S3, film deposition processing is performed in a first intrinsic process chamber of the at least two intrinsic process chambers, a film deposition is performed on a capacitance-coupling flat plate structure based on chemical vapor deposition method in the process chamber, and after the processing is completed, the carrier plate enters next intrinsic process chamber to continue film deposition processing;
   S4, the processing of the intrinsic layer silicon film is completed in the intrinsic process chambers, and then the carrier plate enters the isolation chamber and the doping process chamber sequentially to perform the deposition process of the N-type silicon film or the P-type silicon film;

S5, after step S4 is completed, the carrier plate is unloaded through the unloading chamber; and S6, the rollers of the return mechanism return the carrier plate to the loading chamber, and the carrier plate is kept warm during the process.

4. The method for film deposition the heterojunction solar cell according to claim 3, wherein the preheating chamber comprises:

a heating preheating chamber configured to heat the carrier plate loaded with the solar cell wafer to be processed; and a preheating buffer chamber located between the heating preheating chamber and the intrinsic process chambers and configured to adjust gas and pressure atmosphere.

5. The method for film deposition the heterojunction solar cell according to claim 4, wherein step S2 comprises:

preheating the carrier plate by non-contact heating in the heating preheating chamber to reach a temperature required by the process; and then sending the carrier plate to the preheating buffer chamber to adjust the gas and pressure atmosphere in the chamber so that the carrier plate directly enters the intrinsic process chambers.

6. A method for producing a heterojunction solar cell using a film deposition apparatus, wherein the film deposition apparatus comprises a loading chamber, a preheating chamber, an unloading chamber, and a process chamber;

the process chamber comprises at least two intrinsic process chambers configured to deposit an intrinsic layer silicon film and at least one doping process chamber configured to deposit an N-type silicon film or a P-type silicon film;

the chambers are isolated by isolation valves, the chambers of the film deposition apparatus are linearly arranged in an order of the loading chamber, the preheating chamber, the at least two intrinsic process chambers, the at least one doping process chamber, and the unloading chamber;

a pressure difference between the process chambers of the same type is less than 20%, and the film deposition apparatus is provided with a carrier plate configured to be loaded with a solar cell wafer to be processed;

wherein after the carrier plate loaded with the solar cell wafer is transported to the loading chamber, the carrier plate is heated and the gas and pressure atmosphere are adjusted in the preheating chamber, then the carrier plate is transported to the intrinsic process chambers, and the film deposition processing of the intrinsic layer silicon film is completed in steps in at least two intrinsic process chambers, and then the carrier plate is transported to the doping process chamber, and the deposition of N-type silicon film or P-type silicon film is completed through at least one doping process chamber, wherein when the doping process chamber is working, the intrinsic process chambers are in a waiting state or in a deposition state on the heterojunction solar cell wafer on another carrier plate.

7. The method for film deposition the heterojunction solar cell according to claim 6, wherein the carrier plate is transferred synchronously though a roller mechanism, and when the carrier plate is transferred between adjacent process chambers, the isolation valve between the chambers is opened, and process gas is constantly introduced into the chambers.

8. The method for film deposition the heterojunction solar cell according to claim 6, comprising:

S1, the carrier plate is transported in the loading chamber;

S2, the carrier plate is preheated to reach a temperature required by the process, and the gas and pressure atmosphere is adjusted in the preheating chamber so that the carrier plate directly enters the intrinsic process chambers;

S3, film deposition processing is performed in a first intrinsic process chamber of the at least two intrinsic process chambers, a film deposition is performed on a capacitance-coupling flat plate structure based on chemical vapor deposition method in the process chamber, and after the processing is completed, the carrier plate enters next intrinsic process chamber to continue film deposition processing;

S4, the processing of the intrinsic layer silicon film is completed in the intrinsic process chambers, and then the carrier plate enters the doping process chamber to perform the deposition process of the N-type silicon film or the P-type silicon film;

S5, after step S4 is completed, the carrier plate is unloaded through the unloading chamber; and S6, the rollers of the return mechanism return the carrier plate to the loading chamber, and the carrier plate is kept warm during the process.

9. The method for film deposition the heterojunction solar cell according to claim 8, wherein the preheating chamber comprises:

a heating preheating chamber configured to heat the carrier plate loaded with the solar cell wafer to be processed; and a preheating buffer chamber located between the heating preheating chamber and the intrinsic process chambers and configured to adjust gas and pressure atmosphere.

10. The method for film deposition the heterojunction solar cell according to claim 9, wherein step S2 comprises:

preheating the carrier plate by non-contact heating in the heating preheating chamber to reach a temperature required by the process; and then sending the carrier plate to the preheating buffer chamber to adjust the gas and pressure atmosphere in the chamber so that the carrier plate directly enters the intrinsic process chambers.

* * * * *